United States Patent
Kato

(10) Patent No.: US 9,397,593 B2
(45) Date of Patent: Jul. 19, 2016

(54) MOTOR CONTROL DEVICE

(75) Inventor: Masanori Kato, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/395,360

(22) PCT Filed: Jun. 5, 2012

(86) PCT No.: PCT/JP2012/064475
§ 371 (c)(1),
(2), (4) Date: Oct. 17, 2014

(87) PCT Pub. No.: WO2013/183118
PCT Pub. Date: Dec. 12, 2013

(65) Prior Publication Data
US 2015/0130380 A1  May 14, 2015

(51) Int. Cl.
*H02P 6/12* (2006.01)
*H02P 27/04* (2016.01)
*H02M 5/458* (2006.01)
*H02H 7/08* (2006.01)
*H02H 7/09* (2006.01)
*H02P 27/08* (2006.01)
*H02P 29/00* (2016.01)
*H02P 29/02* (2016.01)
(Continued)

(52) U.S. Cl.
CPC ............... *H02P 6/12* (2013.01); *G01R 31/028* (2013.01); *H02P 27/085* (2013.01); *H02P 29/0033* (2013.01); *H02P 29/026* (2013.01); *G01R 31/42* (2013.01)

(58) Field of Classification Search
CPC .................................................. H02M 7/53871

USPC .................. 318/803, 400.02, 400.12, 400.22; 363/37

See application file for complete search history.

(56) References Cited

U.S. PATENT DOCUMENTS

| | | | | |
|---|---|---|---|---|
| 7,132,816 | B1 * | 11/2006 | Markunas | ............... H02P 21/00 318/400.02 |
| 7,567,085 | B2 | 7/2009 | Kim et al. | |
| 8,093,905 | B2 | 1/2012 | Yamanaka | |

(Continued)

FOREIGN PATENT DOCUMENTS

| | | |
|---|---|---|
| JP | 3-269269 A | 11/1991 |
| JP | 7-92212 A | 4/1995 |

(Continued)

OTHER PUBLICATIONS

International Search Report of PCT/JP2012/064475, dated Sep. 11, 2012. [PCT/ISA/210].

(Continued)

*Primary Examiner* — Paul Ip
*Assistant Examiner* — Devon Joseph
(74) *Attorney, Agent, or Firm* — Sughrue Mion, PLLC

(57) ABSTRACT

A ripple current that flows into a main-circuit capacitor is estimated based on a system impedance and output power to a motor, thereby making it possible to always perform ripple-current estimation and life estimation computation for the main-circuit capacitor online. Because data of the system impedance which largely affects the ripple-current estimation for the main-circuit capacitor is used, the capacitor ripple current can be estimated according to the magnitude of the system impedance. This enables highly-accurate life estimation computation of the main-circuit capacitor.

4 Claims, 3 Drawing Sheets

(51) Int. Cl.
  *G01R 31/02* (2006.01)
  *G01R 31/42* (2006.01)

(56) References Cited

U.S. PATENT DOCUMENTS

| | | | | |
|---|---|---|---|---|
| 2005/0169018 A1* | 8/2005 | Hatai | ................ | H02M 7/53871 |
| | | | | 363/37 |
| 2008/0129217 A1* | 6/2008 | Orr | .................... | H05B 41/2827 |
| | | | | 315/276 |
| 2008/0278109 A1* | 11/2008 | Qian | .................... | H02M 1/126 |
| | | | | 318/803 |
| 2010/0007361 A1* | 1/2010 | Yamanaka | ................ | H02J 1/14 |
| | | | | 324/678 |

FOREIGN PATENT DOCUMENTS

| | | | |
|---|---|---|---|
| JP | 7-92213 A | 4/1995 |
| JP | 9-290970 A | 11/1997 |
| JP | 11-69834 A | 3/1999 |
| JP | 11-163074 A | 6/1999 |
| JP | 11-190754 A | 7/1999 |
| JP | 11-231008 A | 8/1999 |
| JP | 11-356036 A | 12/1999 |
| JP | 2002-25872 A | 1/2002 |
| JP | 2002-251688 A | 9/2002 |
| JP | 2002-281735 A | 9/2002 |
| JP | 2004-120969 A | 4/2004 |
| JP | 2004-170361 A | 6/2004 |
| JP | 2006-229130 A | 8/2006 |
| JP | 2006-284294 A | 10/2006 |
| JP | 2006-524332 A | 10/2006 |
| JP | 2007-49837 A | 2/2007 |
| JP | 2007-57368 A | 3/2007 |
| JP | 2007-244161 A | 9/2007 |
| JP | 2007-295655 A | 11/2007 |
| JP | 2007-318838 A | 12/2007 |
| JP | 2007-318872 A | 12/2007 |
| JP | 2008-17613 A | 1/2008 |
| JP | 2008-86113 A | 4/2008 |
| JP | 2008-164453 A | 7/2008 |
| JP | 2009-281985 A | 12/2009 |
| JP | 2011-119428 A | 6/2011 |
| KR | 10-2004-0111632 A | 12/2004 |
| KR | 10-2009-0031748 A | 3/2009 |
| WO | 2008/016050 A1 | 2/2008 |

OTHER PUBLICATIONS

Communication dated Mar. 25, 2016 from the Korean Intellectual Property Office in counterpart application No. 10-2014-7036135, 5 pages.

* cited by examiner

MOTOR CONTROL DEVICE

CROSS REFERENCE TO RELATED APPLICATIONS

This application is a National Stage of International Application No. PCT/JP2012/064475 filed Jun. 5, 2012, the contents of all of which are incorporated herein by reference in their entirety.

FIELD

The present invention relates to a motor control device, and more particularly to a motor control device having a function of estimating the life of a main-circuit capacitor that forms and stabilizes a bus voltage of a switching circuit.

BACKGROUND

In a switching circuit that is a main element of an inverter unit in a motor control device, a switching element, arranged between opposite-polarity DC busbars, performs switching of a bus voltage to generate driving power to a motor. The bus voltage of this switching circuit is a DC voltage that is stabilized by a smoothing capacitor by removing a ripple component from a DC voltage obtained by rectifying an input AC voltage by a converter circuit. The smoothing capacitor that forms and stabilizes a bus voltage of the switching circuit as described above is referred to as "main-circuit capacitor".

In a motor control device, a ripple current caused by a ripple component included in an output current from a converter circuit flows to a smoothing capacitor. A ripple current caused by a ripple component included in regenerative power that is output from a switching circuit to DC busbars at the time of a regenerative operation of a motor driven by an inverter unit also flows to this smoothing capacitor.

When a ripple current flows, the smoothing capacitor that is constituted by an electrolytic capacitor generates heat. Due to thermal stress associated with a temperature increase in an aluminum electrolytic capacitor used as the smoothing capacitor, the life of the aluminum electrolytic capacitor is shortened according to the Arrhenius law.

However, in a motor control device including a switching circuit that switches ON/OFF a switching element to generate driving AC power to a motor, because of the structural reasons of the motor control device, it is difficult to arrange a current sensor that detects a ripple current that flows to a smoothing capacitor. Therefore, in a conventional motor control device, a method of diagnosing shortening of the life of a smoothing capacitor without using a ripple current has been adopted. Three specific examples are described below.

First conventional example: A method has been known, in which upon switching OFF a main power supply of a motor control device, a constant current I flows for a given period $\Delta\tau$ to measure a voltage drop $\Delta V$ in a smoothing capacitor during the given period $\Delta\tau$, and then a residual capacitance C of the smoothing capacitor is calculated using the equation "$C=(I\times\Delta\tau)/\Delta V$", and is compared with an allowable value of the capacitor capacitance, thereby diagnosing shortening of the life offline. In this first conventional example, the residual capacitance of the smoothing capacitor can be calculated with high accuracy without calculating the amount of thermal stress.

Second conventional example: A technique has been proposed in Patent Literature 1, in which there are provided a unit that detects the temperature of a smoothing capacitor, a unit that calculates an amount of thermal stress in the smoothing capacitor by using a coefficient normalized by a carrier frequency and a coefficient normalized by an output voltage command, and a unit that accumulates the amount of thermal stress during an operating time of a motor control device, in which output power to a motor is calculated from the voltage command, and the amount of thermal stress in the smoothing capacitor is calculated from the output power, thereby computing the accumulated life of the smoothing capacitor. In this second conventional example, by accumulating the amount of thermal stress in the smoothing capacitor, shortening of the life of the smoothing capacitor can be predicted online.

Third conventional example: A technique has been proposed in Patent Literature 2, in which based on a prediction result of shortening of the life of a smoothing capacitor, at the point in time when the smoothing capacitor is predicted to have reached the end of its life, output power from a motor control device is reduced or is shut-off. The motor control device disclosed in Patent Literature 2 has a configuration of determining whether the smoothing capacitor has reached the end of its life. Therefore, the smoothing capacitor is prevented from overheating, and thus from being broken. An unstable motor control caused by an increase in the amplitude of a ripple voltage associated with a decrease in the capacitor capacitance can be prevented. Further, a switching element is prevented from being applied with an overvoltage, and thus from being broken. Accordingly, the motor control device can take advantage of the endurance of the device as much as possible.

CITATION LIST

Patent Literatures

Patent Literature 1: Japanese Patent Application Laid-open No. 2007-049837
Patent Literature 2: Japanese Patent Application Laid-open No. 2004-120969

SUMMARY

Technical Problem

However, in the motor control device that detects shortening of the life of the smoothing capacitor offline, when the motor control device continues to operate for a long time, the smoothing capacitor may reach the end of its life without detecting its residual capacitance. Therefore, each time maintenance is performed, the main power supply of the motor control device needs to be switched ON/OFF. Therefore, there is a problem of inefficient maintenance.

In the motor control device that calculates the amount of thermal stress in the smoothing capacitor from the temperature of the smoothing capacitor and a voltage command, and that computes the accumulated amount of thermal stress, a ripple component is included in an output current from a converter circuit that rectifies AC power, input from a system power supply through an inserted system impedance, by using diode bridges. This ripple component largely depends on the system impedance. Therefore, there is a problem in that it is difficult to accurately calculate the amount of thermal stress in the smoothing capacitor, and a desired accuracy in life-estimation cannot be obtained.

Further, in the motor control device that automatically reduces or shuts-off the output to the motor when the smoothing capacitor is determined to have reached the end of its life, a life extending procedure cannot be performed unless an operator checks a display and an alarm in the motor control device to confirm a life determination result. That is, when the operator omits the display and the alarm, the life extending procedure is not performed, and the motor control device shuts-off the output based on the life determination. Therefore, there is a problem in that a desired lifetime cannot be satisfied.

The present invention has been achieved to solve the above problems, and an object of the present invention is to provide a motor control device that can estimate shortening of the life of a main-circuit capacitor online with high accuracy without detecting a ripple current that flows into the main-circuit capacitor.

Solution to Problem

The present invention is directed to a motor control device that achieves the object. The motor control device includes a converter circuit that converts AC power of a system power supply, which is input through an inserted system impedance, to DC power via full-wave rectification and that outputs the DC power between positive and negative DC busbars, a main-circuit capacitor that removes a ripple component included in a bus voltage between the positive and negative DC busbars to smooth and stabilize the bus voltage, an inverter unit that performs switching of the bus voltage, formed and stabilized by the main-circuit capacitor, according to a control signal to convert the bus voltage to an AC voltage and to generate AC power for driving a motor, and an inverter control unit that generates the control signal that controls a switching operation of the inverter unit, based on a detected output current to the motor, a set operating-speed command, and a set carrier frequency. The motor control device further includes a voltage detection unit that detects a DC voltage applied to the main-circuit capacitor; the inverter control unit that computes output power to the motor based on the DC voltage detected by the voltage detection unit, the detected output current to the motor, and the set carrier frequency; a system-impedance setting unit that sets the inserted system impedance; a first storage unit that stores therein ripple-current calculation data; a capacitor ripple-current estimation unit that estimates a ripple current through the main-circuit capacitor, based on the system impedance set in the system-impedance setting unit, the output power calculated by the inverter control unit, the set carrier frequency, and the ripple-current calculation data prepared in advance in the first storage unit; an ambient temperature sensor that detects an ambient temperature of the main-circuit capacitor; a second storage unit that stores therein capacitor life data; a capacitor life estimation unit that estimates an internal temperature of the main-circuit capacitor based on the DC voltage detected by the voltage detection unit, the ambient temperature of the main-circuit capacitor detected by the ambient temperature sensor, and the capacitor life data prepared in advance in the second storage unit, estimates a lifetime of the main-circuit capacitor by using the estimated internal temperature, calculates an accumulated capacitor lifetime and a capacitor life consumption ratio by using the estimated internal temperature and lifetime, and stores, repeatedly for every life computation cycle, the accumulated capacitor lifetime and the capacitor life consumption ratio in the second storage unit; a capacitor life determination unit that compares the accumulated capacitor lifetime estimated by the capacitor life estimation unit with a reference lifetime stored in the second storage unit as capacitor life data, and that generates a pre-alarm when the accumulated capacitor lifetime and the reference lifetime are substantially equal to each other; and a display unit that displays at least the pre-alarm generated by the capacitor life determination unit.

Advantageous Effects of Invention

According to the present invention, based on a system impedance and output power to a motor, a ripple current that flows to a main-circuit capacitor can be estimated without detecting the ripple current in the main-circuit capacitor. Therefore, ripple-current estimation and life estimation computation for the main-circuit capacitor can always be executed online. At that time, because data of the system impedance which largely affects the ripple-current estimation for the main-circuit capacitor is used, the capacitor ripple current can be estimated according to the magnitude of the system impedance. This enables highly-accurate life estimation computation of the main-circuit capacitor.

DESCRIPTION OF EMBODIMENTS

Exemplary embodiments of a motor control device according to the present invention will be explained below in detail with reference to the accompanying drawings. The present invention is not limited to the embodiments.

First Embodiment

Figure 1:
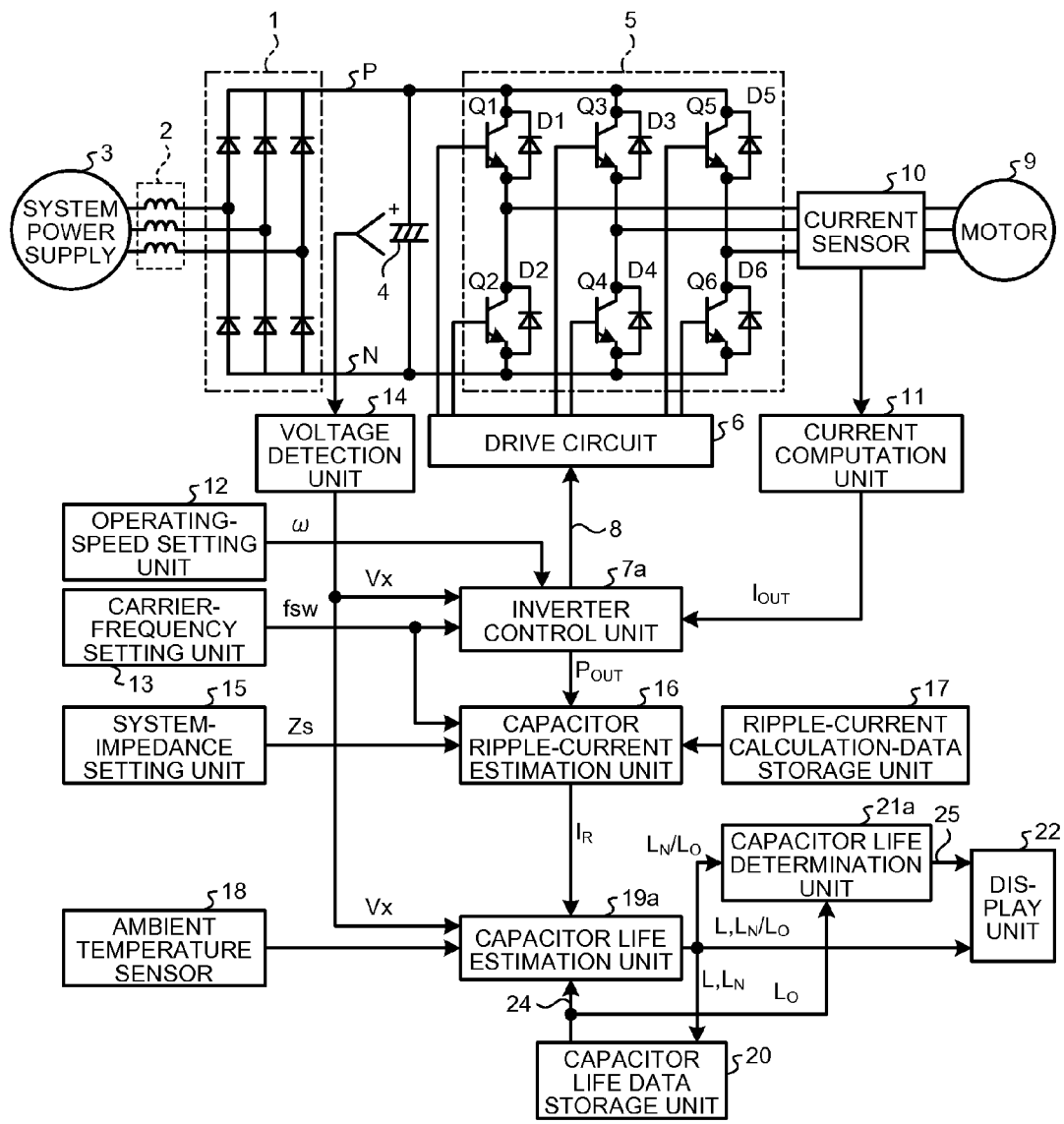
FIG. 1 is a block diagram showing a configuration of a motor control device according to a first embodiment of the present invention.

FIG. 1 is a block diagram showing a configuration of a motor control device according to a first embodiment of the present invention. In FIG. 1, a configuration of estimating the life of a main-circuit capacitor is shown while utilizing a part of a general configuration of a motor control device.

First, the general configuration of the motor control device is briefly explained below.

In FIG. 1, a converter circuit 1 is a three-phase full-wave rectifying circuit that is configured by diode bridges. An AC input end of the converter circuit 1 is connected to a system power supply 3 through an inserted system impedance (a reactor) 2. A DC output end of the converter circuit 1 is connected to a positive busbar P and a negative busbar N. That is, the converter circuit 1 performs three-phase full-wave rectification on a three-phase AC voltage of the system power supply 3, which is input through the inserted system impedance 2, to convert the three-phase AC voltage to a DC voltage that includes a ripple component, and to output the DC voltage to between the positive busbar P and the negative busbar N.

A smoothing capacitor 4 and a switching circuit 5 are arranged in parallel between the positive busbar P and the negative busbar N. The smoothing capacitor 4 removes the ripple component included in the DC voltage rectified and output between the positive busbar P and the negative busbar N by the converter circuit 1, in order to form a stable bus voltage. Hereinafter, the smoothing capacitor 4 is referred to as "main-circuit capacitor 4".

The switching circuit 5 has a configuration in which a series circuit of switching elements Q1 and Q2, a series circuit of switching elements Q3 and Q4, and a series circuit of switching elements Q5 and Q6 are arranged in parallel between the positive busbar P and the negative busbar N. Diodes D1 to D6 are connected respectively to the switching elements Q1 to Q6 in inverse-parallel.

A control terminal of each of the switching elements Q1 to Q6 is connected to an output end of a drive circuit 6. The drive circuit 6 individually ON/OFF-drives the switching elements Q1 to Q6 according to a switching pulse (a PWM signal) from an inverter control unit 7a. The switching circuit 5 and the drive circuit 6 in their entirety is a so-called inverter unit. In the respective series circuits, a connection end between the switching elements Q1 and Q2, a connection end between the switching elements Q3 and Q4, and a connection end between the switching elements Q5 and Q6 serve as output ends. A power-supply cable leading to a motor 9 is connected to each of the output ends. A current sensor 10 is provided on the power-supply cable leading to the motor 9.

A current computation unit 11 computes an output current $I_{OUT}$ based on a current detected by the current sensor 10. The inverter control unit 7a generates a switching pulse (a PWM signal) 8 to the drive circuit 6 based on the output current $I_{OUT}$ computed by the current computation unit 11, an operating-speed command ω set in an operating-speed setting unit 12, and a carrier frequency $f_{SW}$ that is a switching frequency of the switching circuit 5 and is set in a carrier-frequency setting circuit 13.

A voltage detection unit 14, a system-impedance setting unit 15, a capacitor ripple-current estimation unit 16, a ripple-current calculation-data storage unit 17, an ambient temperature sensor 18, a capacitor life estimation unit 19a, a capacitor life data storage unit 20, a capacitor life determination unit 21a, and a display unit 22 are added to the general configuration described above, and the inverter control unit 7a has few more additional functions so as to estimate the life of the main-circuit capacitor 4 online.

A ripple current, caused by a ripple component included in an output current from the converter circuit 1, flows to the main-circuit capacitor 4. A ripple current, caused by a ripple component included in regenerative power, which is output from the switching circuit 5 to the DC busbars (P and N) at the time of a regenerative operation of the motor 9, flows to the main-circuit capacitor 4. The main-circuit capacitor 4 generates heat due to these ripple currents.

Heat generation in the main-circuit capacitor 4 is expressed by the following equation (1), where a capacitor internal temperature is denoted as Tx.

$$Tx = Ta + \Delta Tx = Ta + I_R^2 \times R \times \beta \quad (1)$$

In the equation (1), Ta denotes the ambient temperature of the main-circuit capacitor 4. ΔTx denotes a temperature increase from the ambient temperature. $I_R$ denotes a ripple current that flows to the main-circuit capacitor 4. R denotes an equivalent series resistance of the main-circuit capacitor 4. β denotes a heat release coefficient of the main-circuit capacitor 4.

Thermal stress, associated with a temperature increase in an aluminum electrolytic capacitor used as the main-circuit capacitor 4, shortens the life of the aluminum electrolytic capacitor according to the Arrhenius law. A lifetime L of the aluminum electrolytic capacitor is expressed by the following equation (2).

$$L = L_0 \times [2^{\{(T_0 - T_X)/10\}}] \times (V_0/V_X)^K \quad (2)$$

In the equation (2), Lo denotes a reference lifetime of the main-circuit capacitor 4 under application of a rated voltage and application of a rated ripple voltage at an upper-limit operating temperature. To denotes an allowable internal temperature of the main-circuit capacitor 4. Vo denotes a rated voltage of the main-circuit capacitor 4. Vx denotes a DC voltage applied to the main-circuit capacitor 4 when used. An exponent K denotes an applied voltage reduction rate of the main-circuit capacitor 4.

Figure 2:
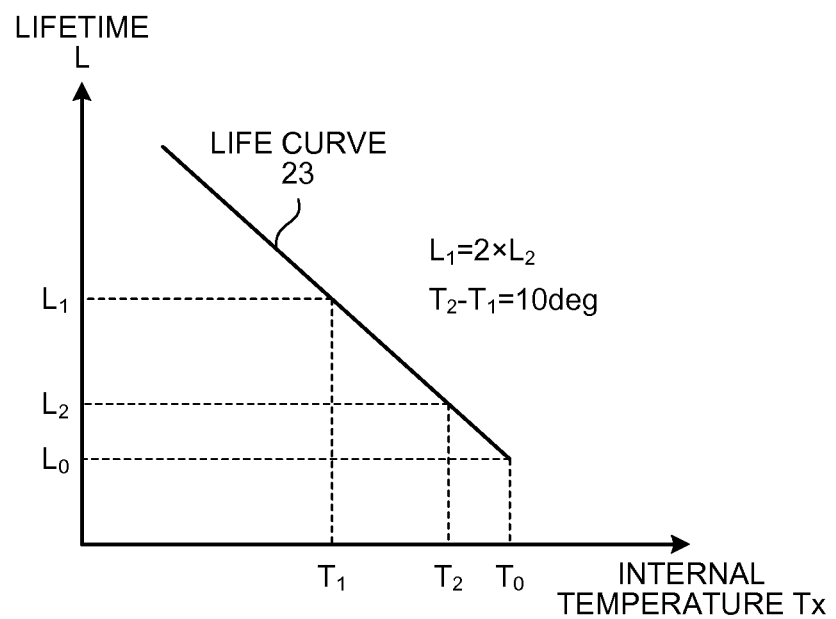
FIG. 2 shows an example of life characteristics of an aluminum electrolyte capacitor used as a main-circuit capacitor.

The relationship between the internal temperature Tx and the lifetime L is as shown in FIG. 2, for example. FIG. 2 shows an example of life characteristics of an aluminum electrolyte capacitor used as a main-circuit capacitor. In FIG. 2, the vertical axis denotes the lifetime L, and the horizontal axis denotes the internal temperature Tx. As shown in FIG. 2, where the allowable internal temperature of the main-circuit capacitor 4 is denoted as To, and the reference lifetime is denoted as Lo, when the internal temperature Tx increases as expressed by $T_1 < T_2 < T_0$, the lifetime L becomes shorter as expressed by $L_1 > L_2 > L_0$ along a life curve 23 that slopes downward to the right.

In FIG. 1, the voltage detection unit 14 detects the DC voltage Vx applied to the main-circuit capacitor 4, and outputs the DC voltage Vx to the inverter control unit 7a and the capacitor life estimation unit 19a.

The inverter control unit 7a computes output power $P_{OUT}$ to the motor 9 based on the operating-speed command ω set in the operating-speed setting circuit 12, the output current $I_{OUT}$ computed by the current computation unit 11, and the DC voltage Vx that is applied to the main-circuit capacitor 4, and is detected by the voltage detection unit 14. The inverter control unit 7a then outputs the output power $P_{OUT}$ to the capacitor ripple-current estimation unit 16.

The capacitor ripple-current estimation unit 16 uses the output power $P_{OUT}$ obtained by the inverter control unit 7a, the carrier frequency $f_{SW}$ set in the carrier-frequency setting circuit 13, an impedance coefficient $Z_S$ of the system impedance 2, which is set in the system-impedance setting unit 15, and coefficients $k_1$ and $k_2$ stored in the ripple-current calculation-data storage unit 17 in the following equation (3) to estimate the ripple current $I_R$ that flows to the main-circuit capacitor 4, and to output the ripple current $I_R$ to the capacitor life estimation unit 19a.

$$I_R = P_{OUT} \times \sqrt{\{(k_1 \times f_{SW})^2 + (Z_S \times k_2)^2\}} \quad (3)$$

The coefficient $k_1$ denotes a carrier ripple-current correction coefficient. The coefficient $k_2$ denotes a system ripple-current correction coefficient.

The capacitor life estimation unit 19a first uses the ambient temperature Ta of the main-circuit capacitor 4, which is measured by the ambient temperature sensor 18, the DC voltage Vx applied to the main-circuit capacitor 4 and measured by the voltage detection unit 14, the ripple current $I_R$ estimated by the capacitor ripple-current estimation unit 16, and life calculation data 24 stored in the capacitor life data storage unit 20, in the above equation (1) to calculate the internal temperature Tx of the main-circuit capacitor 4.

The relationship between the internal temperature Tx and the lifetime L of the main-circuit capacitor 4 is defined by the equation (2). Therefore, the capacitor life estimation unit 19a uses the calculated internal temperature Tx, the life calculation data 24 stored in the capacitor life data storage unit 20, the equation (2), and an equation (4) to be described later and defines an accumulated capacitor lifetime $L_N$, in order to calculate a capacitor life consumption ratio $L_N/L_0$. $L_0$ denotes a reference lifetime.

The accumulated capacitor lifetime $L_N$ and the capacitor life consumption ratio $L_N/L_0$ that are calculated by the capacitor life estimation unit 19a are stored in the capacitor life data storage unit 20, and are also output to the capacitor life determination unit 21a and the display unit 22.

That is, as the life calculation data 24, the equivalent series resistance R of the main-circuit capacitor 4, the heat release coefficient β, the rated voltage $V_0$, the applied voltage reduction rate k, the allowable internal temperature $T_0$, the reference lifetime $L_0$, previous accumulated life data $L_{N-1}$, and the like are stored in the capacitor life data storage unit 20.

The equation (4) that defines the accumulated capacitor lifetime $L_N$ is explained below.

$$L_N = L_{N-1} + (\Delta t \times k_3)/3600 \quad (4)$$

In the equation (4), $\Delta t$ denotes a life shortening computation cycle [second]. $k_3$ denotes a life coefficient that is obtained by the following equation (5).

$$k_3 = [2^{\{(T_0-T_X)/10\}}] \times (V_0/V_X)^K \quad (5)$$

The capacitor life determination unit 21a compares the accumulated capacitor lifetime $L_N$ in the capacitor life consumption ratio $L_N/L_0$ estimated by the capacitor life estimation unit 19a with the reference lifetime $L_0$ in the life calculation data 24 stored in the capacitor life data storage unit 20.

$$L_N \cong L_0$$

When the above relationship holds, the capacitor life determination unit 21a generates and displays a pre-alarm 25 on the display unit 22.

Therefore, the display unit 22 can display the lifetime L of the main-circuit capacitor 4, the life consumption ratio $L_N/L_0$, and the pre-alarm 25 online.

As described above, according to the first embodiment, based on a system impedance and output power to a motor, a ripple current that flows to a main-circuit capacitor can be estimated without detecting the ripple current that flows in the main-circuit capacitor. Therefore, ripple-current estimation and life estimation computation for the main-circuit capacitor can always be executed online.

Because data of a system impedance which largely affects the ripple-current estimation for the main-circuit capacitor is used, the capacitor ripple current can be estimated according to the magnitude of the system impedance. This enables highly-accurate life estimation computation of the main-circuit capacitor.

Second Embodiment

Figure 3:
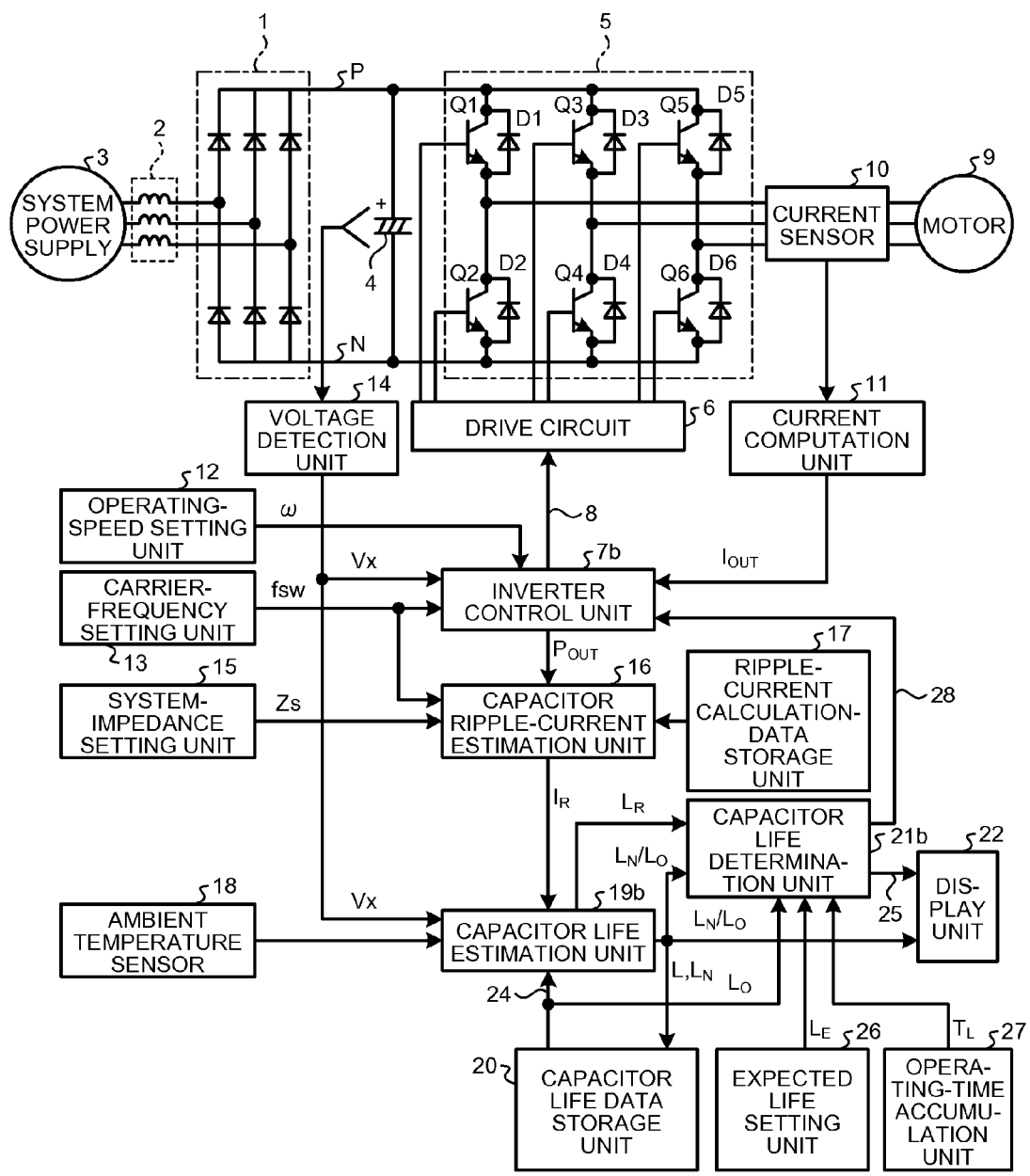
FIG. 3 is a block diagram showing a configuration of a motor control device according to a second embodiment of the present invention.

FIG. 3 is a block diagram showing a configuration of a motor control device according to a second embodiment of the present invention. In FIG. 3, constituent elements identical or equivalent to those shown in FIG. 1 (the first embodiment) are denoted by like reference signs. Parts related to the second embodiment are mainly explained below.

As shown in FIG. 3, in the motor control device according to the second embodiment, an expected life setting unit 26 and an operating-time accumulation unit 27 are added to the configuration shown in FIG. 1 (the first embodiment), and an inverter control unit 7b, a capacitor life estimation unit 19b, and a capacitor life determination unit 21b are provided, which are respectively denoted by different reference sings from their corresponding units in the first embodiment.

The capacitor life estimation circuit 19b uses the following equation (6) to calculate and output a remaining lifetime $L_R$ of the main-circuit capacitor 4 to the capacitor life determination unit 21b.

$$L_R = (L_D - L_N) \times [2^{\{(T_0-T_X)/10\}}] \times (V_0/V_X)^K \quad (6)$$

The expected life setting unit 26 outputs a set expected lifetime $L_E$ of the main-circuit capacitor 4 to the capacitor life determination unit 21b. The operating-time accumulation unit 27 accumulates and outputs an operating time $T_L$ of the motor control device to the capacitor life determination unit 21b.

The capacitor life determination unit 21b compares a difference between the expected lifetime $L_E$ and the operating time $T_L$ of the motor control device with the remaining lifetime $L_R$ of the main-circuit capacitor 4.

$$L_R \leq L_E - T_L$$

When the above relationship holds, the capacitor life determination unit 21b determines that the expected lifetime $L_E$ of the main-circuit capacitor 4 set in the expected life setting unit 26 cannot be satisfied, and outputs a power reduction command 28 to the inverter control unit 7b.

Upon receiving the power reduction command 28 from the capacitor life determination unit 21b, the inverter control unit 7b outputs the switching pulse 8 to the drive circuit 6 so as to reduce output power from the motor control device, that is, output power to the motor 9. This restricts the upper limit value of output power from the motor control device, and therefore can suppress a temperature increase in the main-circuit capacitor 4, thereby satisfying the expected lifetime $L_E$ of the main-circuit capacitor 4, which is set in the expected life setting unit 26.

As described above, according to the second embodiment, in a case where the ambient temperature of the motor control device is so high that the life of the main-circuit capacitor 4 cannot satisfy its expected lifetime, even when a maintenance operator does not check a capacitor life consumption ratio or a pre-alarm displayed on a display unit, and therefore does not perform a life extending procedure, the main-circuit capacitor can satisfy a desired expected lifetime, although output power from the motor control device is restricted to some extent.

INDUSTRIAL APPLICABILITY

As described above, the motor control device according to the present invention is useful as a motor control device that can estimate the life of a main-circuit capacitor online with high accuracy without detecting a ripple current that flows to the main-circuit capacitor.

REFERENCE SIGNS LIST

1 converter circuit
2 system impedance
3 system power supply
4 smoothing capacitor (main-circuit capacitor)
5 switching circuit
6 drive circuit
7a, 7b inverter control unit
9 motor
10 current sensor
11 current computation unit
12 operating-speed setting unit
13 carrier-frequency setting unit
14 voltage detection unit
15 system-impedance setting unit
16 capacitor ripple-current estimation unit
17 ripple-current calculation-data storage unit
18 ambient temperature sensor
19a, 19b capacitor life estimation unit
20 capacitor life data storage unit
21a, 21b capacitor life determination unit 22 display unit
26 expected life setting unit
27 operating-time accumulation unit

The invention claimed is:

1. A motor control device including:
a converter circuit that converts AC power of a system power supply, which is input through an inserted system impedance, to DC power via full-wave rectification and that outputs the DC power between positive and negative DC busbars;
a main-circuit capacitor that removes a ripple component included in a bus voltage between the positive and negative DC busbars to smooth and stabilize the bus voltage;
an inverter unit that performs switching of the bus voltage, formed and stabilized by the main-circuit capacitor, according to a control signal to convert the bus voltage to an AC voltage and to generate AC power for driving a motor;
a voltage detection unit that detects a DC voltage applied to the main-circuit capacitor;
an inverter control unit that that generates the control signal that controls a switching operation of the inverter unit, and computes an output power to the motor based on the detected DC voltage, a detected output current to the motor, and a set carrier frequency;
a system-impedance setting unit that sets the inserted system impedance as an impedance parameter;
a first storage unit that stores, in advance, ripple-current calculation data;
a capacitor ripple-current estimation unit that estimates a ripple current through the main-circuit capacitor, based on the inserted system impedance set as the impedance parameter, the output power calculated by the inverter control unit, the set carrier frequency, and the stored ripple-current calculation data;
an ambient temperature sensor that detects an ambient temperature of the main-circuit capacitor;
a second storage unit that stores, in advance, a capacitor life data;
a capacitor life estimation unit that estimates an internal temperature of the main-circuit capacitor based on the detected DC voltage, the detected ambient temperature of the main-circuit capacitor, the stored capacitor life data, and the estimated ripple current, estimates a lifetime of the main-circuit capacitor by using the estimated internal temperature, calculates an accumulated capacitor lifetime and a capacitor life consumption ratio by using the estimated internal temperature and the estimated lifetime, and stores, repeatedly for every lifetime computation cycle, the accumulated capacitor lifetime and the capacitor life consumption ratio in the second storage unit;
a capacitor life determination unit that compares the calculated accumulated capacitor lifetime with a reference lifetime stored in the second storage unit as the capacitor life data, and generates a pre-alarm when the accumulated capacitor lifetime and the reference lifetime are substantially equal to each other; and
a display unit that displays the generated pre-alarm.

2. The motor control device according to claim 1, further comprising:
an expected life setting unit that sets an expected lifetime of the main-circuit capacitor; and
an operating-time accumulation unit that accumulates an operating time of the motor control device;
wherein the capacitor life estimation unit estimates a remaining lifetime of the main-circuit capacitor by using the estimated internal temperature,
the capacitor life determination unit obtains a difference between the expected lifetime of the main-circuit capacitor and the accumulated operating time of the motor control device, compares the obtained difference with the estimated remaining lifetime of the main-circuit capacitor, and outputs a power reduction command upon determining that the expected lifetime of the main-circuit capacitor cannot satisfy the estimated remaining lifetime, and
the inverter control unit changes the control signal output to the inverter unit to a control signal that decreases the output power to the motor, when the power reduction command is output from the capacitor life determination unit.

3. The motor control device according to claim 1, wherein the first storage unit stores ripple-current coefficients related to the ripple current, and
the capacitor ripple-current estimation unit estimates the ripple current based on the ripple-current coefficients.

4. The motor control device according to claim 1, wherein the capacitor life estimation unit uses the accumulated capacitor lifetime, which has been calculated in a previous lifetime computation cycle and stored in the second storage unit, in a calculation of the accumulated capacitor lifetime being performed in a current lifetime computation cycle.

* * * * *